United States Patent
Taniguchi et al.

(10) Patent No.: US 6,172,580 B1
(45) Date of Patent: Jan. 9, 2001

(54) SURFACE ACOUSTIC WAVE LADDER FILTER WITH SPECIFIC GAP LENGTH BETWEEN ELECTRODE TIPS AND THE OPPOSING BUS BAR

(75) Inventors: Norio Taniguchi; Tadamasa Ushiroku, both of Ishikawa-ken (JP)

(73) Assignee: Murata Manufacturing Co., Ltd., Kyoto (JP)

( * ) Notice: Under 35 U.S.C. 154(b), the term of this patent shall be extended for 0 days.

(21) Appl. No.: 09/317,806

(22) Filed: May 24, 1999

(30) Foreign Application Priority Data

May 26, 1998 (JP) .................................... 10-144654

(51) Int. Cl.[7] ........................................ H03H 9/64
(52) U.S. Cl. .................... 333/193; 333/195; 310/313 B
(58) Field of Search ................... 333/193–196; 310/313 R, 313 B, 313 C, 313 D

(56) References Cited

U.S. PATENT DOCUMENTS

| | | | | |
|---|---|---|---|---|
| 4,799,184 | * | 1/1989 | Grassl | 333/193 X |
| 5,077,545 | * | 12/1991 | Gopani et al. | 333/195 |
| 5,708,403 | * | 1/1998 | Morozumi et al. | 333/194 |
| 5,793,266 | * | 8/1998 | Allen et al. | 333/193 |
| 5,909,156 | * | 6/1999 | Nishihara et al. | 333/193 |
| 5,963,113 | * | 10/1999 | Ou et al. | 333/193 |

FOREIGN PATENT DOCUMENTS

| | | |
|---|---|---|
| 5-183380 | 7/1993 | (JP) . |
| 6-188673 | 7/1994 | (JP) . |

* cited by examiner

Primary Examiner—Benny Lee
Assistant Examiner—Barbara Summons
(74) Attorney, Agent, or Firm—Keating & Bennett, LLP

(57) ABSTRACT

A surface acoustic wave filter having a ladder type circuit configuration includes a series resonator in a series arm provided between input and output terminals and a parallel resonator included in a parallel arm provided between the series arm and a reference potential. The surface acoustic wave filter includes a piezoelectric substrate, and a plurality of one-port surface acoustic wave resonators disposed on the piezoelectric substrate and arranged to define the series resonator and the parallel resonator. The one-port surface acoustic wave resonators include interdigital transducers. A gap length or distance between a first bus bar of the interdigital transducer of at least one of the surface acoustic wave resonators and the tip of an electrode finger connected to a second bus bar which is disposed opposite to the first bus bar has a value of up to about 1.0 λ in which λ represents the wave length of a surface acoustic wave.

18 Claims, 13 Drawing Sheets

SURFACE ACOUSTIC WAVE LADDER FILTER WITH SPECIFIC GAP LENGTH BETWEEN ELECTRODE TIPS AND THE OPPOSING BUS BAR

BACKGROUND OF THE INVENTION

1. Field of the Invention

The present invention relates to a surface acoustic wave filter for use as a band filter, and more particularly, to a surface acoustic wave filter having a ladder-type circuit configuration including a plurality of one-port surface acoustic wave resonators.

2. Description of the Related Art

An $LiTaO_3$ substrate is advantageous in that it has a relatively high electromechanical coefficient and the temperature characteristics thereof are relatively stable. Accordingly, the $LiTaO_3$ substrate is widely used as the piezoelectric substrate of a surface acoustic wave resonator or a surface acoustic wave filter.

For example, Japanese Unexamined Patent Publication No. 6-188673 discloses a surface acoustic wave filter having a ladder type circuit defined by disposing a plurality of surface acoustic wave resonators on the $LiTaO_3$ substrate. In this prior art, in order to realize desired impedance characteristics, it is suitable to adjust the numbers of the electrode finger pairs and the apertures (cross widths) in the surface acoustic wave resonators.

Further, Japanese Unexamined Patent Publication No. 5-183380 discloses a surface acoustic wave filter having a ladder type circuit configuration defined by a plurality of surface acoustic wave resonators. It is described in this reference that in order to obtain a desired electrode capacitance, the numbers of the electrode finger pairs and the apertures are carefully selected. The electrode capacitance of the surface acoustic wave resonator is determined substantially by the product of the number of the electrode finger pairs, the aperture, and the dielectric constant of a substrate, as described in Japanese Unexamined Patent Publication No. 5-183380. Accordingly, when the $LiTaO_3$ substrate is used as the piezoelectric substrate, the product of the number of the electrode finger pairs and the aperture is determined, depending on an objective electrode capacitance.

However, when the surface acoustic wave filter having a ladder type circuit configuration was produced by using a plurality of surface acoustic wave resonators, and for this purpose, the products of the numbers of the electrode finger pairs and the apertures were made constant so as to obtain an electrode capacitance having a desired value, as described above, an unsatisfactory flatness in the pass band was produced. FIG. 17 shows the attenuation frequency characteristics of a conventional surface acoustic wave filter. As shown by an arrow A in FIG. 17, there is a deficiency in the left-side shoulder portion in the pass band. That is, the attenuation was insufficiently reduced in the lower frequency side range in the pass band. Accordingly, the flatness of the attenuation frequency characteristics in the pass band was unsatisfactory.

SUMMARY OF THE INVENTION

In order to overcome the problems described above, preferred embodiments of the present invention provide a surface acoustic wave filter having an excellent flatness of the attenuation frequency characteristic in the pass band and which has a wide band.

A surface acoustic wave filter according to a preferred embodiment of the present invention has a ladder type circuit configuration and includes a series resonator in a series arm provided between input and output terminals and a parallel resonator included in a parallel arm provided between the series arm and a reference potential. The surface acoustic wave filter includes a piezoelectric substrate, and a plurality of one-port surface acoustic wave resonators disposed on the piezoelectric substrate and arranged to define the series resonator and the parallel resonator. The one-port surface acoustic wave resonators include interdigital transducers. A gap length or distance between a first bus bar of the interdigital transducer of at least one of the surface acoustic wave resonators and the tip of an electrode finger connected to a second bus bar which is disposed opposite to the first bus bar has a value of up to about $1.0\ \lambda$ in which $\lambda$ represents the wave length of a surface acoustic wave.

According to preferred embodiments of the present invention, an unnecessary ripple in the pass band, due to a ripple occurring between the resonant frequency and the anti-resonant frequency of the surface acoustic wave resonator, is prevented. In addition, since the impedance characteristics of each surface acoustic wave resonator are not changed, the above-mentioned ripple is prevented from occurring while still being able to prevent any narrowing of the pass band. Thus, a surface acoustic wave filter having excellent flatness in the pass band and a very wide band is provided.

The gap length of at least one of the one-port surface acoustic wave resonators constituting the parallel resonators preferably has a value of up to about $1.0\ \lambda$. In such a case, a ripple occurring between the resonant frequency and the anti-resonant frequency of the parallel resonators is prevented. As a result, the filter characteristics on the lower frequency side in the pass band are prevented from being degraded, and the flatness in the pass band is greatly improved while the pass band is prevented from being narrowed.

Further, a plurality of the parallel resonators may be provided, and the gap lengths of all the parallel resonators preferably have a value of up to about $1.0\ \lambda$. In addition, the piezoelectric substrate may be an $LiTaO_3$ substrate. With such a unique configuration, the surface acoustic wave filter has a very wide band and very stable temperature characteristics.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

As described above, conventional surface acoustic wave filters having a ladder type circuit configuration defined by a plurality of surface acoustic wave resonators experienced problems with insufficient flatness in a pass band. It is thought that this is due to the fact that the aperture of the electrode fingers is shorter as compared with the wavelength of the surface acoustic wave, and thereby, a ripple caused by an unnecessary mode appears in the pass band.

Particularly, when an LiTaO$_3$ substrate is used, the above ripple appears markedly. The inventors of the present invention discovered that it is very difficult to suppress such ripples by the method disclosed in Japanese Unexamined Patent Publication No. 5-183380, by changing the number of electrode finger pairs and the aperture. In order to show that such ripples cannot be suppressed by the conventional method, this will be described below first before preferred embodiments of the present invention are explained.

Figure 2:
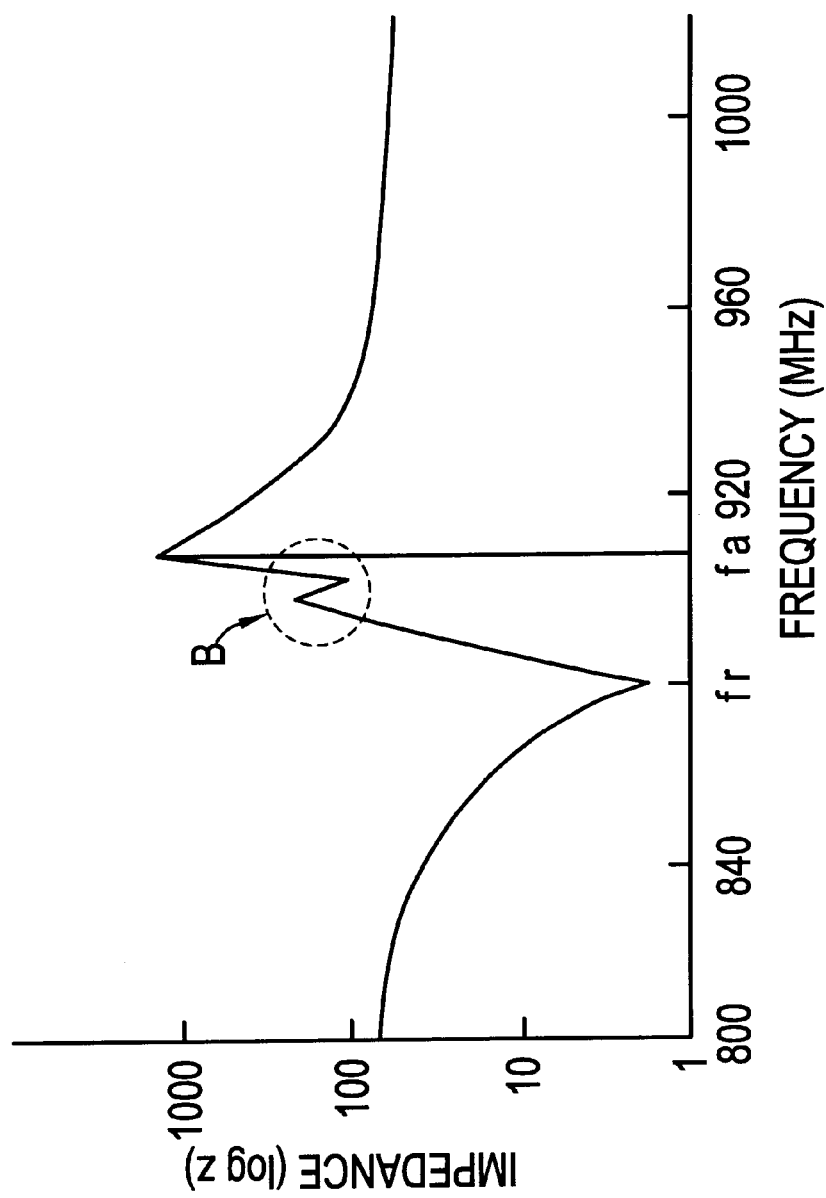
FIG. 2 is a graph showing an example of the impedance characteristics of the conventional one-port surface acoustic wave resonator.

FIG. 2 shows the impedance characteristics of a surface acoustic wave resonator used in the conventional ladder type surface acoustic wave filter. As seen in FIG. 2, a ripple shown by an arrow B is present between the resonant frequency fr and the anti-resonant frequency fa.

The ripple B can be reduced by widening the aperture of the electrode fingers. However, when the aperture is widened, the number of the electrode finger pairs has to be decreased in order to obtain a desired impedance. If the number of the electrode finger pairs is decreased, the interval of frequency between the resonant frequency fr and the anti-resonant frequency fa becomes narrow, so that a wide band filter can not be provided. This will be described in more detail with reference to FIGS. 3 through 8.

FIGS. 3 through 8 illustrate the impedance characteristics obtained when the number of the pairs and the aperture are changed based on condition that the product of the number of the electrode finger pairs and the aperture is constant, namely, 800 λ. For the characteristics shown in FIGS. 3 through 8, the number of the electrode finger pairs and the aperture are listed in the following Table 1.

TABLE 1

Figure 3:
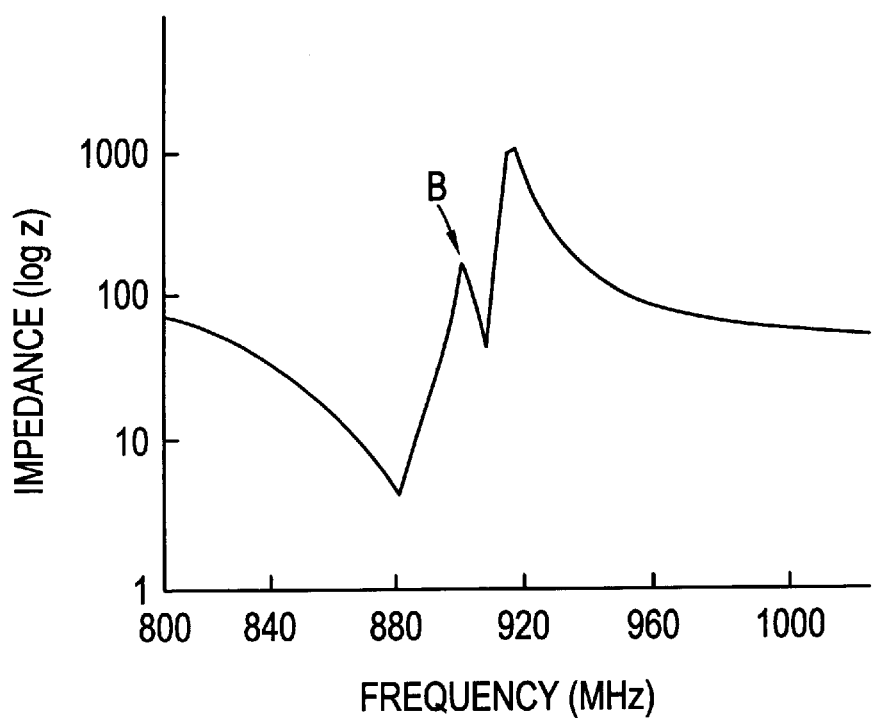
FIG. 3 is a graph showing the impedance characteristic of a one-port surface acoustic wave resonator having 200 electrode finger pairs and an aperture of $4\ \lambda$.
Figure 4:
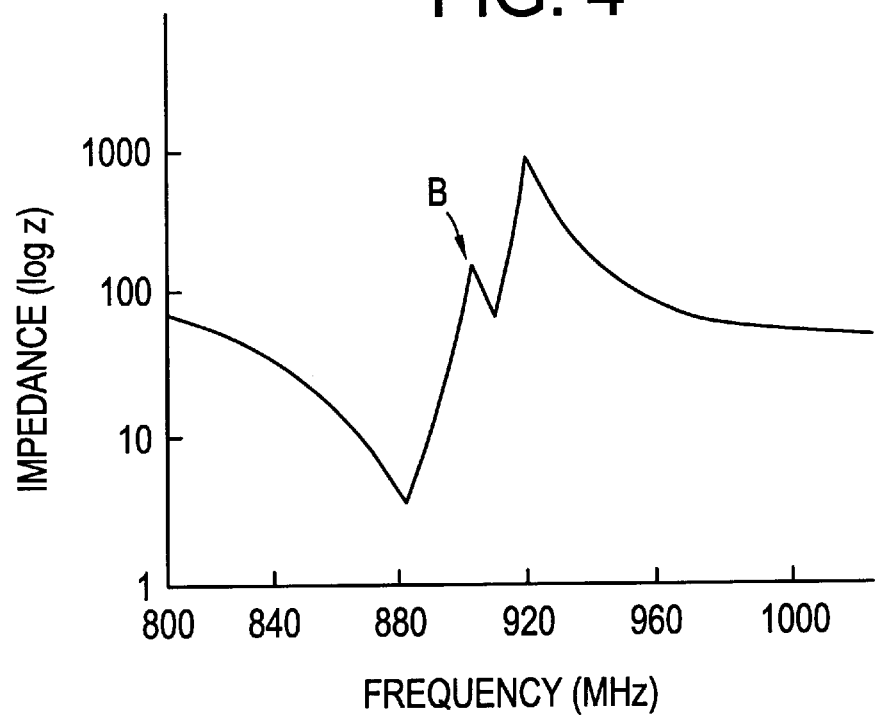
FIG. 4 is a graph showing the impedance characteristic of a one-port surface acoustic wave resonator having 100 electrode finger pairs and an aperture of $8\ \lambda$.
Figure 5:
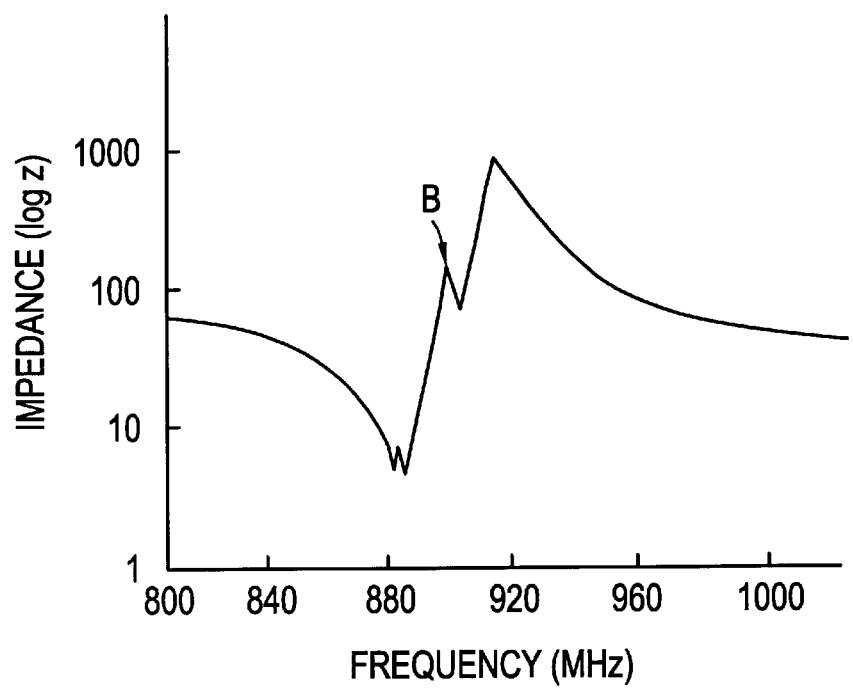
FIG. 5 is a graph showing the impedance characteristic of a one-port surface acoustic wave resonator having 70 electrode finger pairs and an aperture of 11.4 λ.
Figure 6:
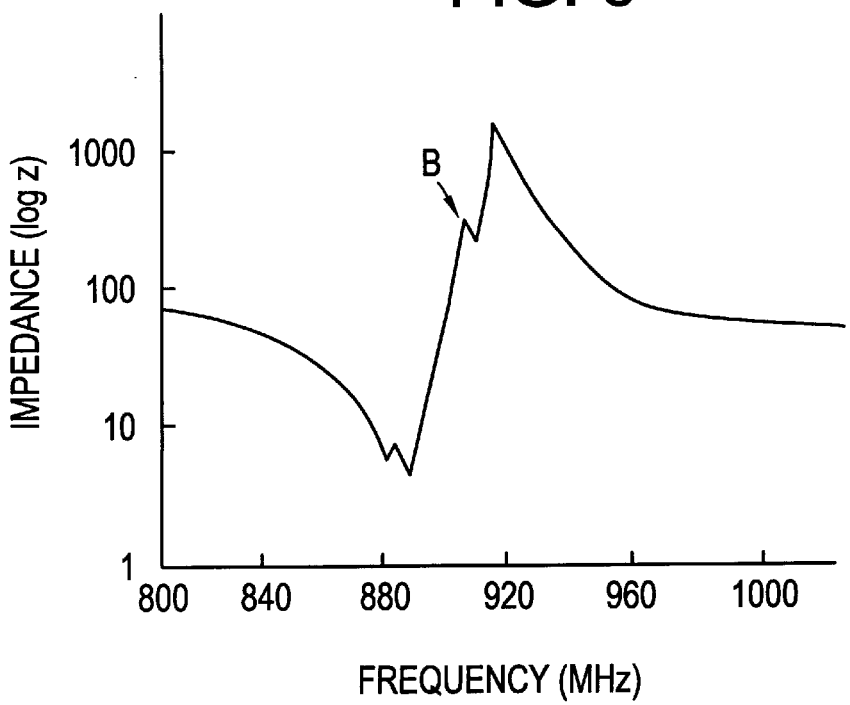
FIG. 6 is a graph showing the impedance characteristic of a one-port surface acoustic wave resonator having 50 electrode finger pairs and an aperture of 16 λ.
Figure 7:
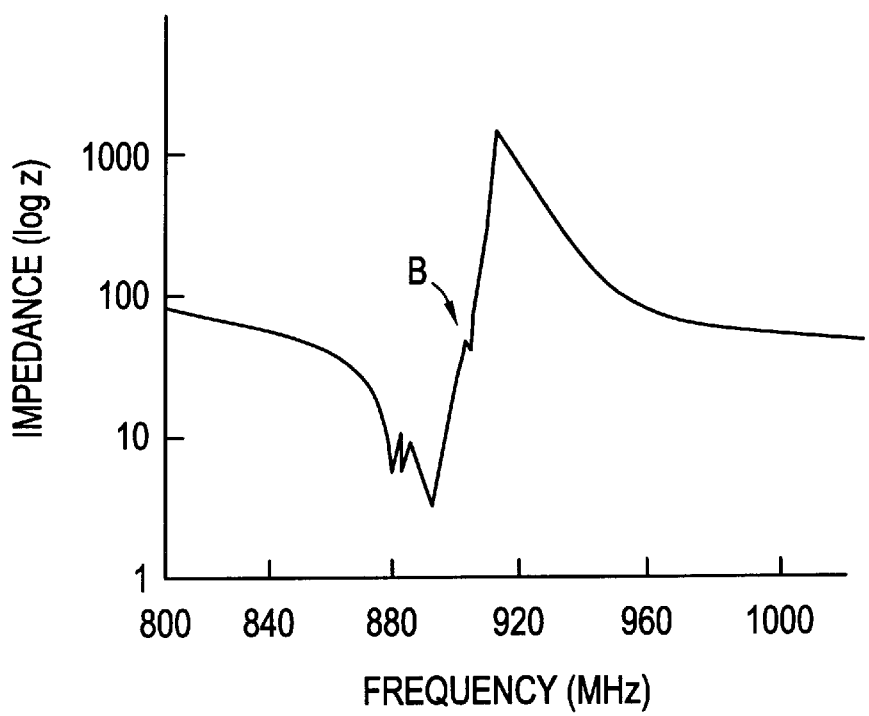
FIG. 7 is a graph showing the impedance characteristic of a one-port surface acoustic wave resonator having 25 electrode finger pairs and an aperture of 32 λ.
Figure 8:
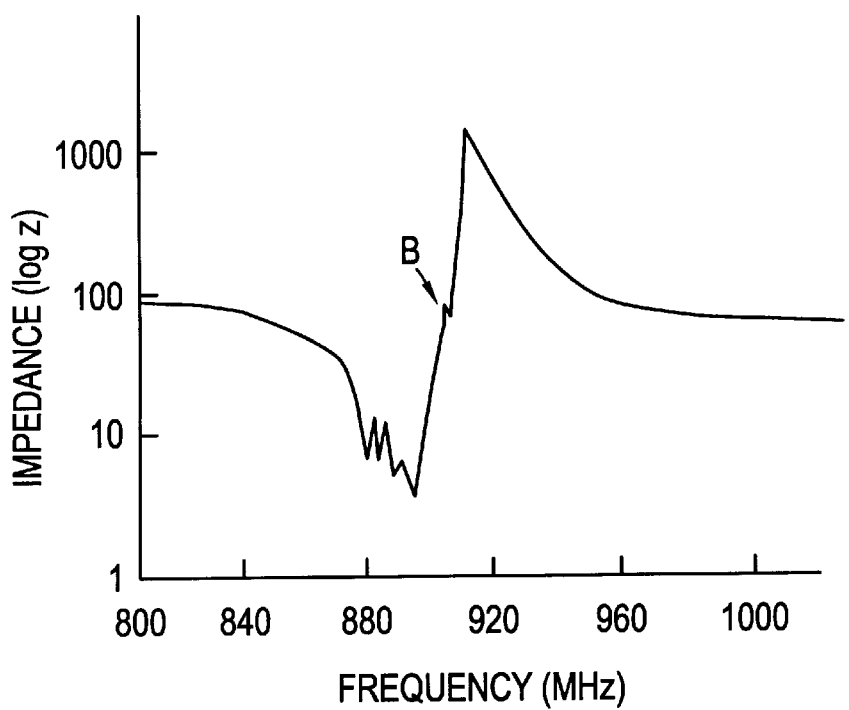
FIG. 8 is a graph showing the impedance characteristic of a one-port surface acoustic wave resonator having 16 electrode finger pairs and an aperture of 50 λ.

|        | Number of Pairs | Aperture |
|--------|-----------------|----------|
| FIG. 3 | 200 pairs       | 4 λ      |
| FIG. 4 | 100 pairs       | 8 λ      |
| FIG. 5 | 70 pairs        | 11.4 λ   |
| FIG. 6 | 50 pairs        | 16 λ     |
| FIG. 7 | 25 pairs        | 32 λ     |
| FIG. 8 | 16 pairs        | 50 λ     |

As apparent from FIGS. 3 through 8, as the number of the electrode finger pairs is reduced and the aperture is widened, the ripple B is decreased. However, the interval of frequency between the resonant frequency fr and the anti-resonant frequency fa becomes narrower.

When the aperture is changed as described above, the frequency at the ripple B remains unchanged. This shows that the above ripple B is not an unnecessary ripple caused by the transversal mode.

As described above, in the case that the product of the number of the electrode finger pairs and the aperture is made constant in order to render a desired value to the electrode capacitance of the surface acoustic wave resonator, the intensity of the ripple B and the interval between the resonant frequency fr and the anti-resonant frequency fa has an inverse or "trade off" relationship. That is, either of them has to be sacrificed.

Figure 9:
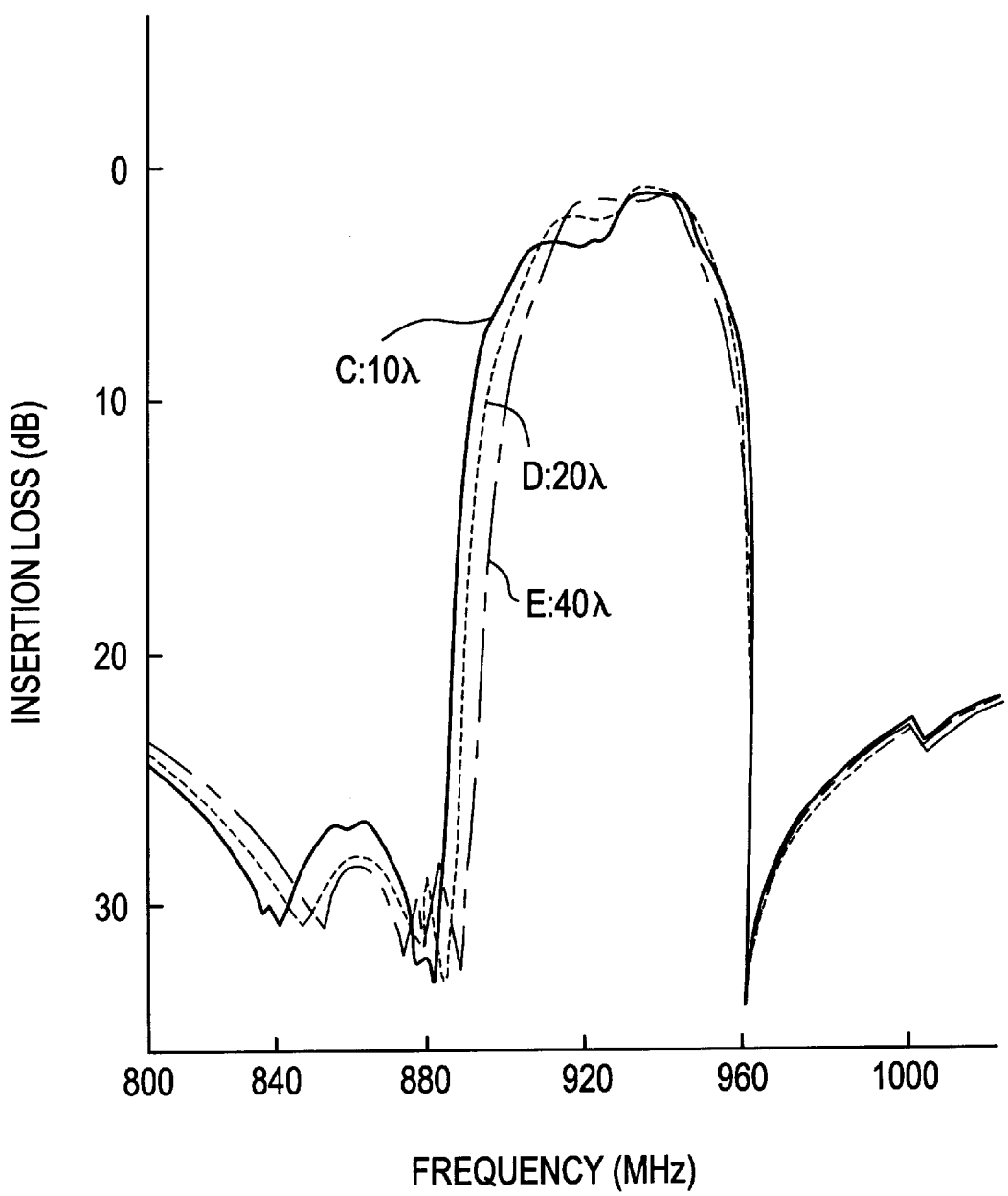
FIG. 9 is a graph showing the filter characteristics of the surface acoustic wave filter obtained under the conditions that the aperture is varied while the product of the electrode finger aperture and the number of the electrode finger pairs is kept constant.

FIG. 9 illustrates the filter characteristics of a conventional ladder type surface acoustic wave filter defined by a plurality of surface acoustic wave resonators as described above. In FIG. 9, the solid line C, the broken line D, and the alternate long and short dash line E represent the characteristics obtained under the conditions that the apertures of the electrode fingers are 10.0 λ, 20.0 λ, and 40.0 λ, respectively. In any case, the product of the aperture and the number of the electrode finger pairs is kept constant, that is, 800 λ.

As seen in FIG. 9, as the aperture of the parallel resonators is wider, the ripple in the band is reduced, while the pass band becomes narrower.

That is, for the conventional surface acoustic wave filter, it was very difficult to reduce the ripple in the band while preventing the pass band from narrowing.

In view of the foregoing, preferred embodiments of the present invention uses a novel structure in order to solve the problem. Hereinafter, preferred embodiments of the present invention will be described.

Figure 1A:
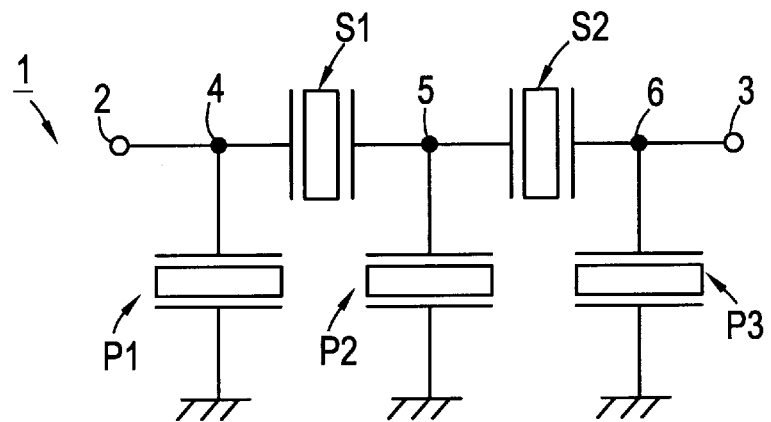
FIG. 1A is a circuit diagram of a surface acoustic wave filter according to a first preferred embodiment of the present invention.
Figure 1B:
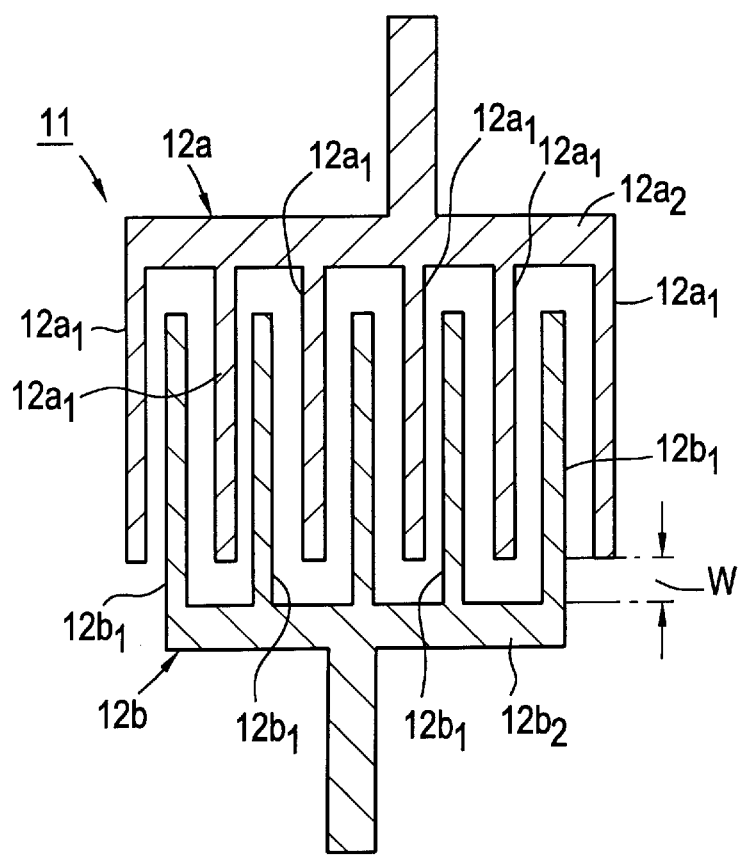
FIG. 1B is a plan view illustrating the electrode structure of an IDT of a one-port surface acoustic wave resonator used in the first preferred embodiment shown in FIG. 1A.

FIG. 1A is a circuit diagram of a surface acoustic wave filter according to a first preferred embodiment of the present invention. FIG. 1B is a plan view illustrating the electrode structure of an IDT of a one-port surface acoustic wave resonator used in the first preferred embodiment shown in FIG. 1A.

In a surface acoustic wave filter 1 of the present preferred embodiment, the line connecting an input terminal 2 and an output terminal 3 is a series arm. First, second, and third parallel arms are provided between the series arm and a reference electrode, and thereby, a ladder type circuit is defined.

Series resonators S1 and S2 are included in the series arm. A first parallel resonator P1 is connected between a node 4, which is located between the input terminal 2 and the series resonator S1, and the reference potential, so as to define a first parallel arm. Further, a second parallel resonator P2 is connected between a node 5, located between the first, second series resonators S1 and S2, and the reference potential, so as to define a second parallel arm. Moreover, a third parallel resonator P3 is connected between a node 6, which is located between the series resonator S2 and the output terminal 3, and the reference potential, so as to define a third parallel arm. The series resonators S1 and S2, and the parallel resonators P1 through P3 each are defined by a one-port surface acoustic wave resonator.

The ladder type circuit configuration having the series resonators S1 and S2 and the parallel resonators P1–P3 as described above has been conventionally known. In contrast to the conventional configuration, a surface acoustic wave filter 1 of the present preferred embodiment has a gap length W or distance between a first bus bar on one side of IDT of the surface acoustic wave resonators constituting the parallel resonators P1–P3 and the tip of each electrode connected to a second bus bar on the side opposite to the first bus bar which has a value of up to about 1.0 λ.

In the present preferred embodiment, the above-described gap length W of the first, second and third parallel resonators P1 through P3 preferably has a value of up to about 1.0 λ, and thereby, the flatness in the pass band is greatly improved while the band width prevented from narrowing. This will be described in more detail below.

For the purpose of improving the flatness in the pass band by eliminating or significantly reducing the influence of the ripple B described above, the frequency at the ripple B, occurring between the resonant frequency and the anti-resonant frequency of each of the series resonators S1 and S2 and the parallel resonator P1–P3, is caused to approach the resonant frequency side. The overall impedance Z0, obtained by combining the impedance ZL of the main resonance of a surface acoustic wave and the impedance ZR of the ripple B, is expressed by the following formula (1):

$$Z0=(ZL \times ZR)/(ZL+ZR)=ZL/(1+ZL/ZR) \quad \text{Equation (1)}$$

In case that the ripple B is absent, Z0=ZL is true. On the contrary, when the ripple B is present, the overall impedance is influenced by the ripple B in the amount of ZL/ZR in the equation (1) and therefore the impedance is far from a desired value. In this case, as ZL becomes smaller while ZR is constant, the influence of ZL/ZR exerted on the overall impedance Z0, due to an unnecessary mode, can be further inhibited.

Based upon the above-described discoveries, the inventors of the present invention conducted investigation of further inhibiting the effects of the above-described ripple B by changing the frequency at the ripple B. As a result, it was discovered that a gap length W of the one port type surface acoustic wave resonator is extremely effective when it has a value of up to about 1.0 λ. This will be described below.

FIG. 1B is a plan view showing the electrode structure of the one-port SAW resonator. A one-port SAW resonator 11 includes an interdigital transducer (IDT) which is defined by arranging one pair of interdigital electrodes 12a and 12b on a piezoelectric substrate (not shown) in such a manner that the electrode fingers are crossed with each other. Grating type reflectors are provided on the opposite sides of the IDT in the surface acoustic wave propagation direction, though not particularly shown in FIG. 1B.

The interdigital electrodes 12a and 12b include a plurality of electrode fingers $12a_1$ and $12b_1$ and bus bars $12a_2$ and $12b_2$ shorting the electrode fingers on one side thereof, respectively. In this case, the above-described gap length W is defined as the length of a gap which lies between the tip of each electrode finger $12a_1$ of the interdigital electrode 12a on one side of the electrode and the bus bar $12b_2$ on the opposite side to the bus bar $12a_2$ to which the electrode fingers $12a_1$ are connected, and extend in the lengthwise direction of the electrode fingers.

With respect to the one-port surface acoustic wave resonator 11, the respective impedance characteristics were determined under the conditions that the gap length W only was changed while the aperture of the electrode fingers and the number of the electrode finger pairs were kept constant. The results are shown in FIGS. 10 through 12.

Figure 10:
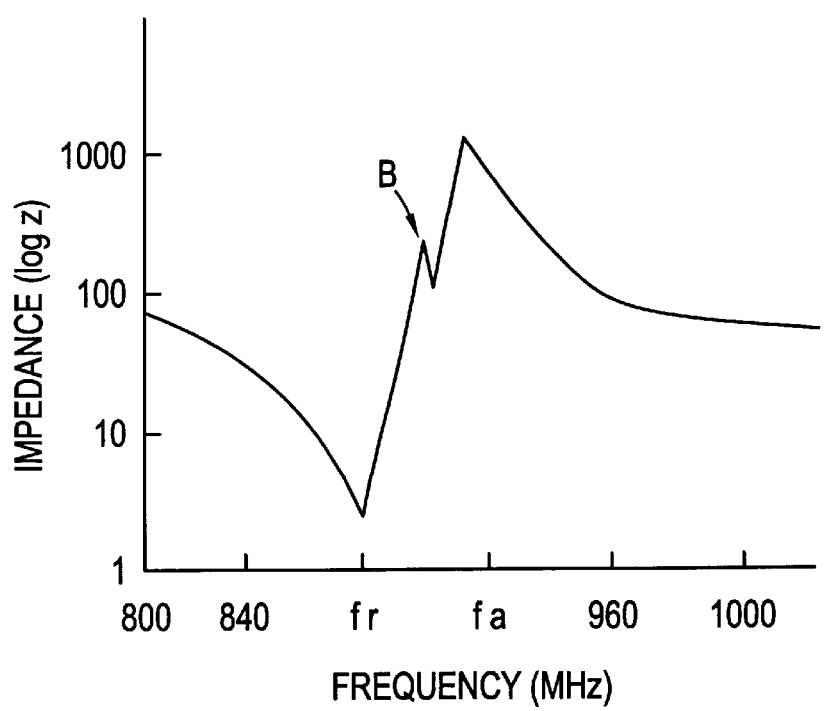
FIG. 10 is a graph showing the impedance characteristic of a one-port surface acoustic wave resonator with a gap length W=2.0 λ.
Figure 11:
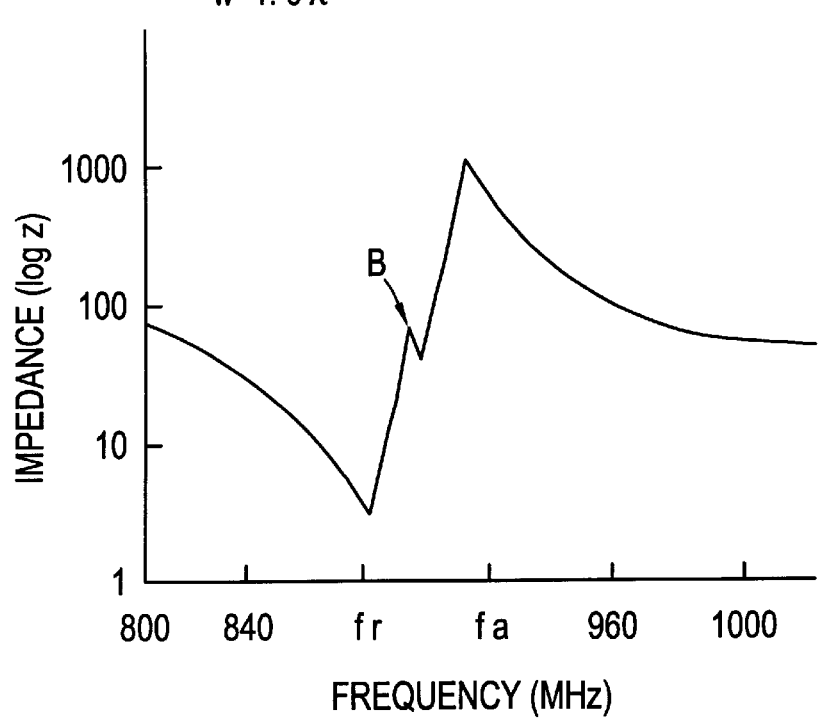
FIG. 11 is a graph showing the impedance characteristic of a one-port surface acoustic wave resonator with a gap length W=1.0 λ.
Figure 12:
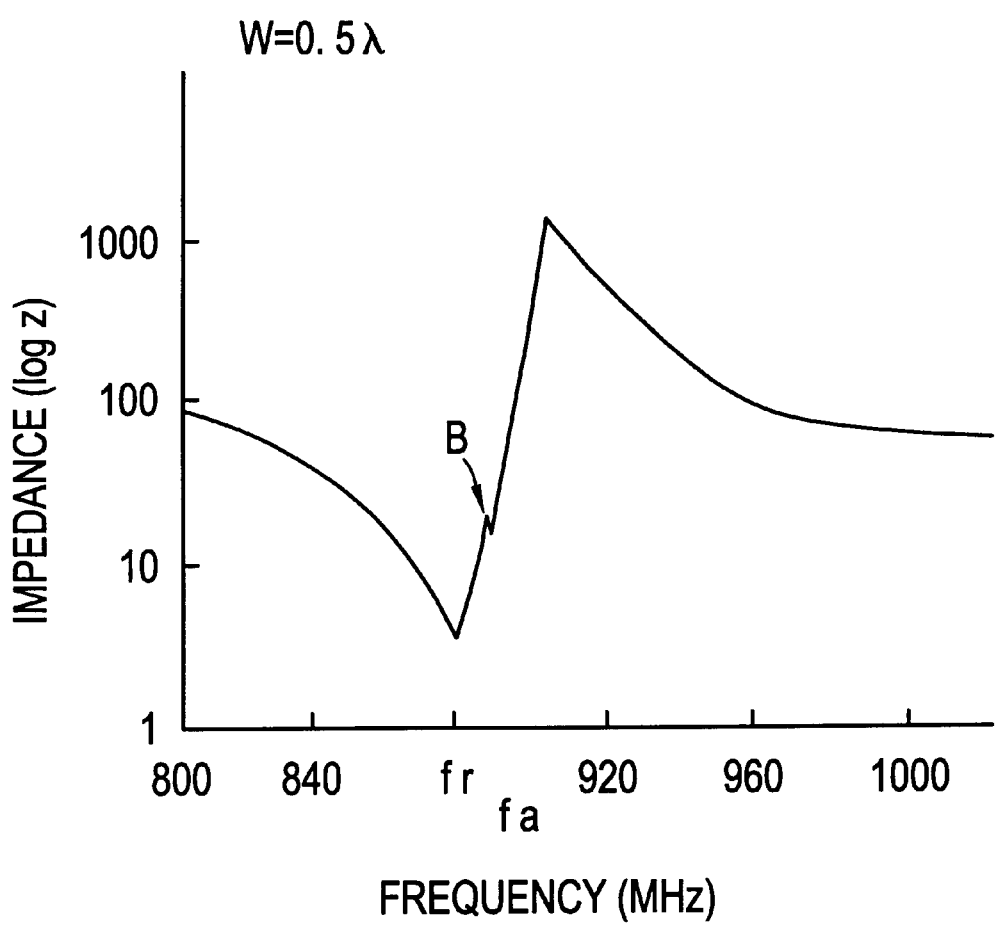
FIG. 12 is a graph showing the impedance characteristic of a one-port surface acoustic wave resonator with a gap length W=0.5 λ.

FIGS. 10, 11, and 12 show the impedance characteristics at the gap lengths W of 2.0 λ, 1.0 λ, and 0.5 λ, respectively. As apparent from FIGS. 10 through 12, as the gap length W becomes smaller, the frequency position at the ripple B between the resonant frequency fr and the anti-resonant frequency fa approaches the resonant frequency side fr, though the impedance characteristics do not experience any change.

Figure 13:
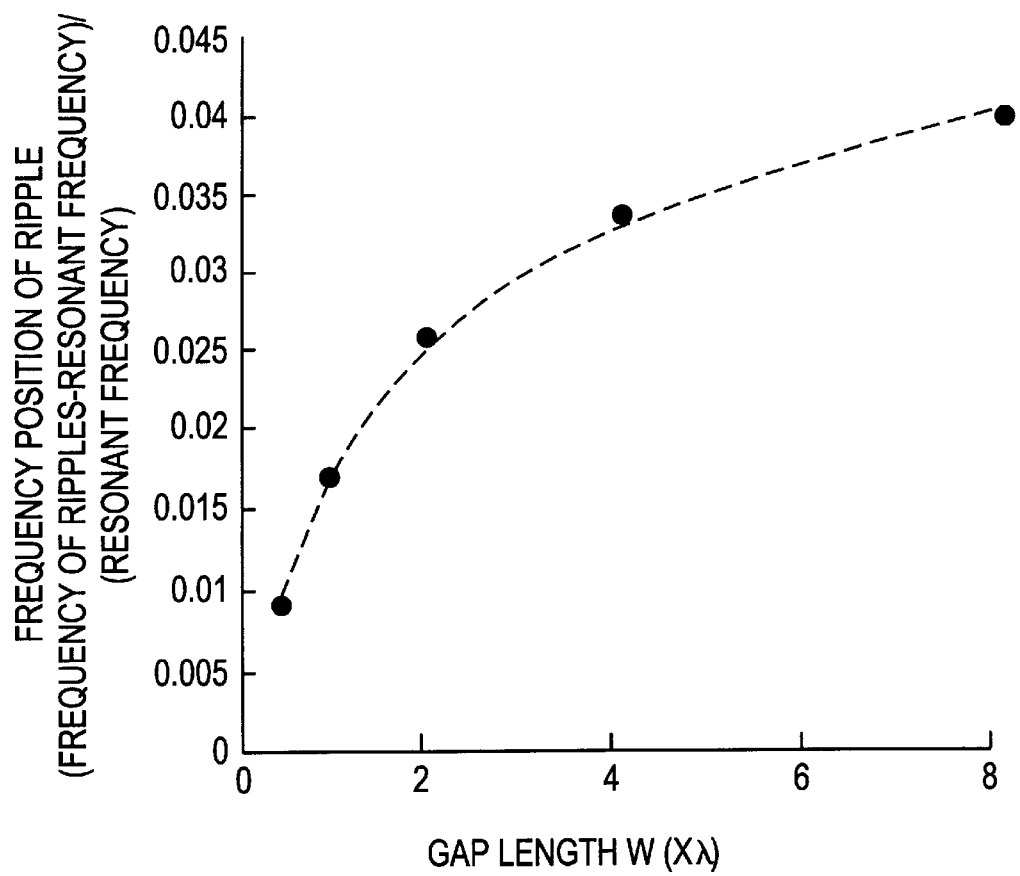
FIG. 13 is a graph showing the relationship between the gap length and the frequency position at which a ripple appears.

FIG. 13 is a graph showing the relationship between the gap length and the frequency position of the ripple B. In FIG. 13, the frequency position of the ripple plotted on the ordinate is expressed as (frequency at which the ripple occurs—resonant frequency)/resonant frequency. That is, the position plotted on the ordinate is expressed by a value which is obtained by standardizing the frequency at which the ripple occurs with the resonant frequency. Therefore, the value of the frequency position of the ripple plotted on the ordinate represents how far the frequency at which the ripple occurs is from the resonant frequency. The increase of the value means that the position is farther from the resonant frequency fr, that is, is nearer to the anti-resonant frequency fa.

As apparent from FIG. 13, the frequency position at which the ripple B occurs is varied by changing the gap length W. It is seen that the position of the ripple B can be made to approach the resonant frequency fr by reducing the gap length W. Accordingly, it is understood that for minimizing the effects of the unnecessary ripple B, it is effective to make the gap length W as short as possible.

More specifically, it is seen that when the gap length W is about 1.0 λ, the frequency position of the ripple B has a value of up to about 0.0175, and is near to the resonant frequency. As a result, the effects of the ripple B are reliably and effectively eliminated.

As described above, when the gap length W has a value of up to about 1.0 λ, the effects of the unnecessary ripple B can be reduced, and excellent impedance characteristics are achieved.

Figure 14:
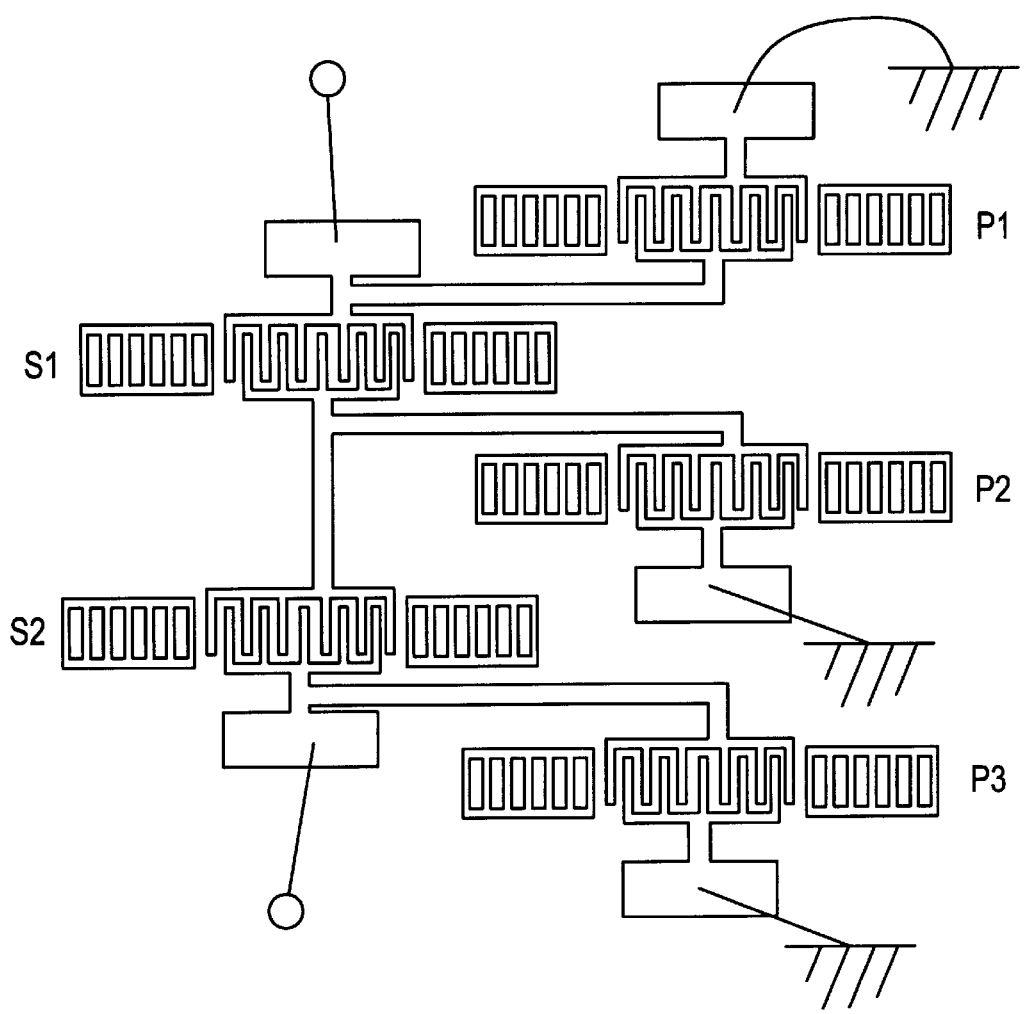
FIG. 14 is a plan view of a surface acoustic wave filter according to a first preferred embodiment of the present invention.

Hereinafter, the specific configuration and characteristics of the surface acoustic wave filter of the present preferred embodiment will be described. FIG. 14 is a plan view of the surface acoustic wave filter of the preferred embodiment shown in FIGS. 1A and 1B.

In the surface acoustic wave filter 1, the plurality of one-port surface acoustic wave resonators preferably made of Al are provided on an LiTaO$_3$ substrate. The plurality of one-port surface acoustic wave resonators correspond to the series resonators S1 and S2 and the parallel resonator P1–P3 shown in FIG. 1.

The wave length, the aperture, the gap length W, and the number of IDTs of the parallel resonator P1–P3 and the series resonators S1 and S2 of the surface acoustic wave filter 1 of the present preferred embodiment are shown in the following Table 2.

TABLE 2

| Resonator | Wave length (μm) | Aperture (μm) | Gap length W (μm) | Number of pairs |
|---|---|---|---|---|
| S1 | 4.00 | 40.0 | 4.00 | 100 |
| S1 | 4.00 | 40.0 | 4.00 | 100 |
| P1 | 4.20 | 42.0 | 2.10 | 150 |
| P2 | 4.20 | 42.0 | 2.10 | 150 |
| P3 | 4.20 | 42.0 | 2.10 | 150 |

As shown in Table 2, the gap lengths W of the parallel resonators P1–P3 are about 0.5 λ. For the series resonators S1 and S2, the gap lengths W are about 1.0 λ as shown in Table 2.

The electrode thickness of each of the above parallel resonators P1–P3 and the series resonators S1 and S2 is preferably about 300 nm, that is, about 7% based on the wavelength.

Figure 15:
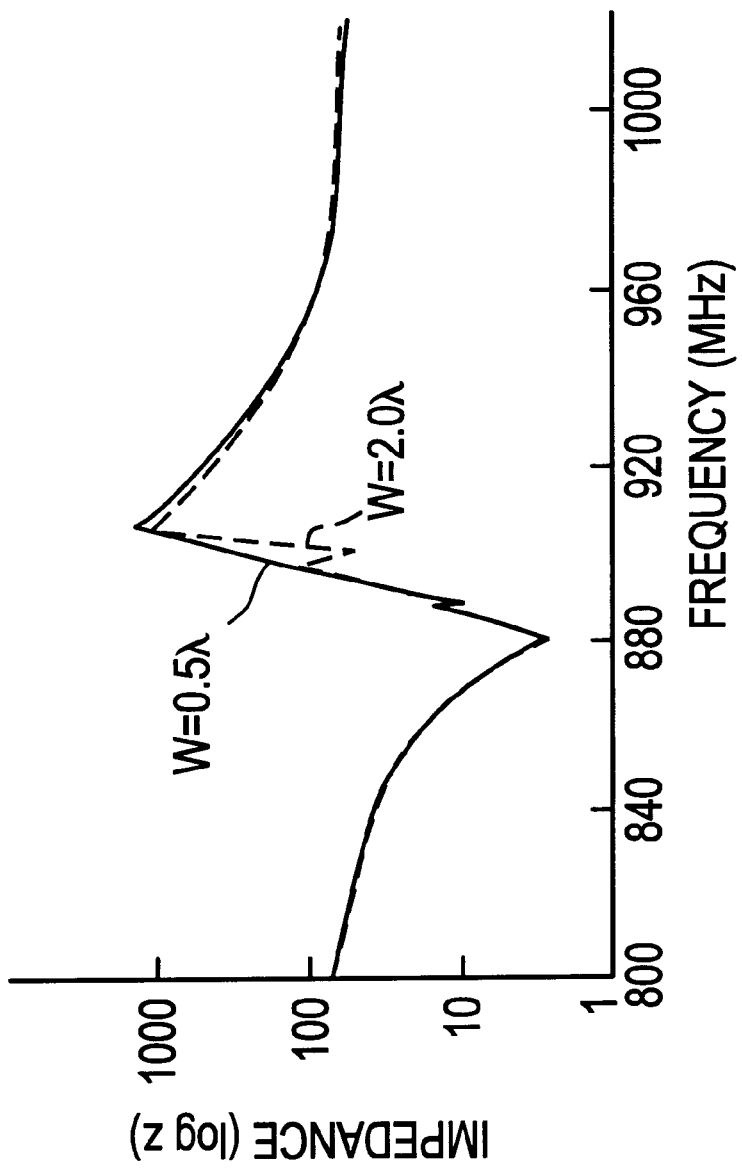
FIG. 15 is a graph showing the impedance characteristic of the parallel resonators used in the first preferred embodiment and an impedance characteristic of a parallel resonator prepared for comparison.

FIG. 15 shows the impedance characteristics of the parallel resonators.

In FIG. 15, the solid line represents the impedance characteristics of the parallel resonators P1–P3 of the present preferred embodiment, and the broken line represents the impedance characteristics of the one-port surface acoustic wave resonators configured in the same manner as the above parallel resonators P1–P3 except that the gap lengths W are about 2.0 λ. The filter characteristics of the surface acoustic wave filter of the above preferred embodiment are represented by an alternate long and short dash line E in FIG. 16.

For comparison, a solid line G in FIG. 15 illustrates the filter characteristics of the surface acoustic wave filter which is formed in the same manner as in the preferred embodiment except that the parallel resonators P1–P3 having a gap length W=2.0 λ shown by the broken line in FIG. 15 are used. Furthermore, a broken line H shows the filter characteristics of the surface acoustic wave filter according to a second preferred embodiment, which is formed in the same manner as in the above-described preferred embodiment except that the parallel resonators P1–P3 having gap lengths W changed to about 1.0 λ are used.

Figure 16:
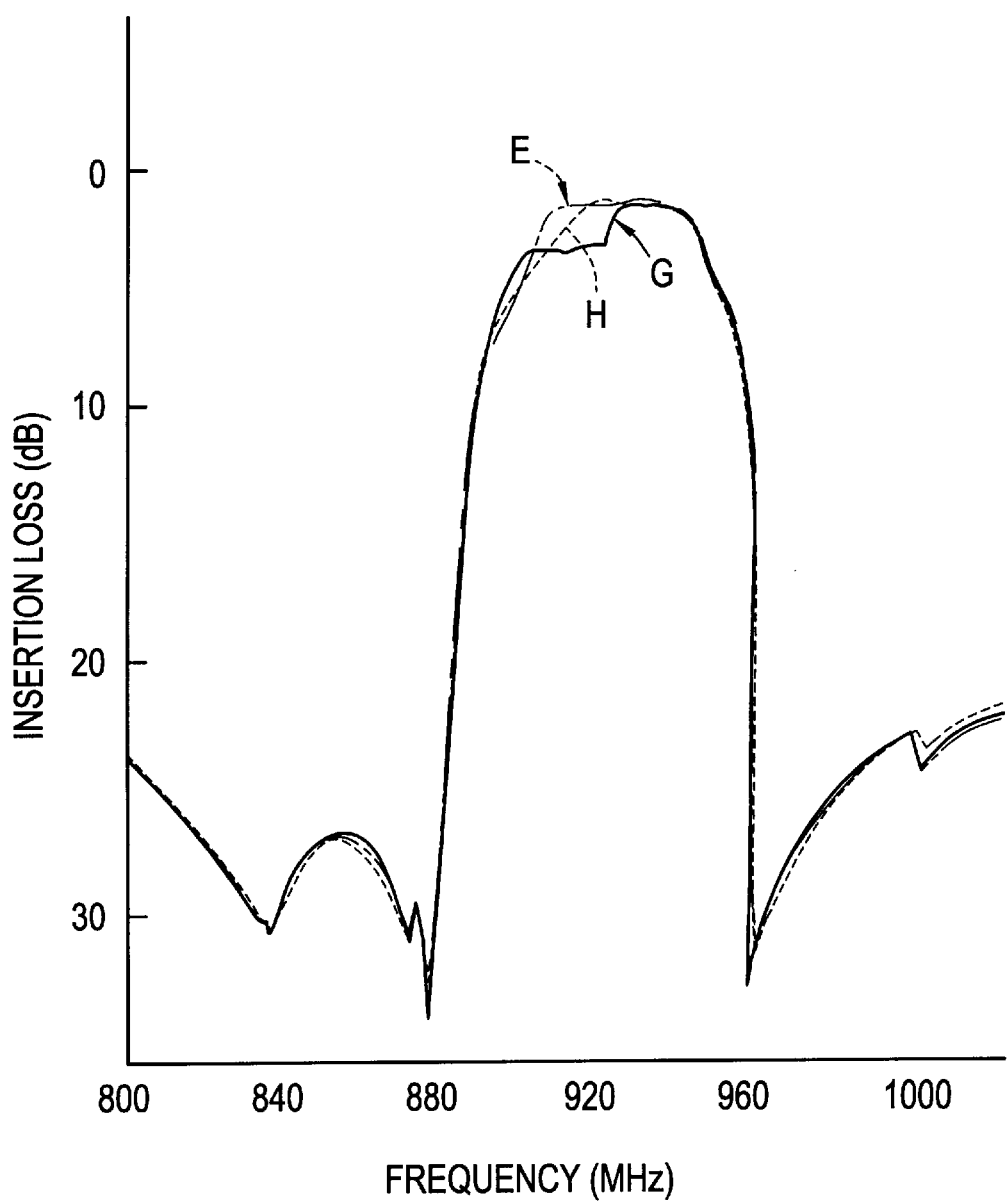
FIG. 16 is a graph showing the filter characteristics of the surface acoustic wave filters of the first and second preferred embodiments and the surface acoustic wave filter prepared for comparison.
Figure 17:
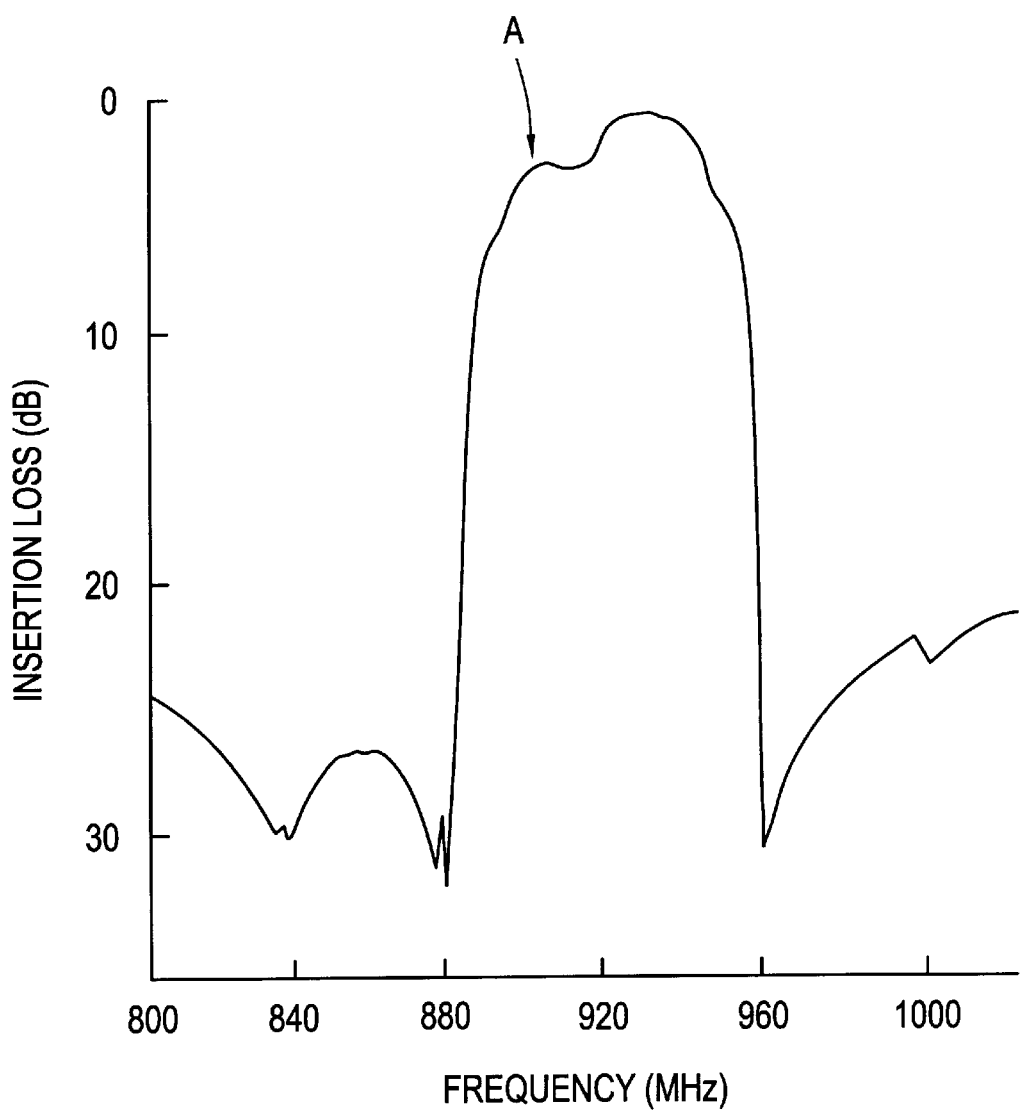
FIG. 17 is a graph showing the filter characteristics of a surface acoustic wave filter having a conventional ladder type circuit configuration.

As seen in FIG. 16, in the case of the gap length W=2.0 λ, a large deficiency exists in the left-side shoulder portion in the pass band, so that good filter characteristics can not be obtained. On the other hand, in the second preferred embodiment in which the gap length W is about 1.0 λ, the deficiency in the left-side shoulder portion in the pass band is greatly reduced, that is, the flatness in the band is significantly improved. Further, when the parallel resonators having a gap length W=0.5 λ are used according to the first preferred embodiment, the flatness in the pass band is further improved, so that excellent filter characteristics and a very wide band are achieved.

In the first and second preferred embodiments, an LiTaO$_3$ substrate may be used as the piezoelectric substrate. However, piezoelectric substrates made of other piezoelectric single crystals of LiNbO$_3$, quartz, and the like may also be used.

In the above first and second preferred embodiments, for all the parallel resonators P1–P3, the gap length W preferably has a value of up to about 1.0 λ. However, the gap length W of at least one of the parallel resonators may have a value of up to about 1.0 λ. Further, for one or more of the surface acoustic wave resonators, the gap length W may have a value of up to about 1.0 λ.

In addition, the ladder type circuit is not restricted to the circuit configuration shown in FIG. 1A. The series resonators and the parallel resonators may be connected so as to define an appropriate number of stages as in the conventionally known ladder type filter.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:
   an input terminal;
   an output terminal;
   a series arm including at least one series resonator located between the input and output terminals;
   a parallel arm including at least one parallel resonator located between the series arm and a reference potential;
   a piezoelectric substrate; and
   a plurality of one-port surface acoustic wave resonators disposed on said piezoelectric substrate and arranged to define said at least one series resonator and said at least one parallel resonator, each of the plurality of one-port surface acoustic wave resonators including an interdigital transducer having a plurality of electrode fingers and at least two bus bars connected to the electrode fingers; wherein
   a gap length between a first of the at least two bus bars of the interdigital transducer of at least one of the plurality of one-port surface acoustic wave resonators and a tip of one of the plurality of electrode fingers connected to a second of the at least two bus bars disposed opposite to the first of the at least two bus bars has a value of up to about 1.0 λ in which λ represents the wave length of a surface acoustic wave.

2. A surface acoustic wave filter according to claim 1, wherein said gap length of at least one of the one-port surface acoustic wave resonators constituting the parallel resonator has a value of up to about 1.0 λ.

3. A surface acoustic wave filter according to claim 1, wherein the surface acoustic wave filter includes a plurality of the parallel resonators, and the gap lengths of each of the parallel resonators has a value of up to about 1.0 λ.

4. A surface acoustic wave filter according to claim 1, wherein said piezoelectric substrate is an LiTaO$_3$ substrate.

5. A surface acoustic wave filter according to claim 1, further comprising first, second and third parallel arms.

6. A surface acoustic wave filter according to claim 5, wherein the first, second, and third parallel arms are located between the at least one series arm and the reference electrode so as to define a ladder type circuit.

7. A surface acoustic wave filter according to claim 1, wherein the series arm includes at least two series resonators.

8. A surface acoustic wave filter according to claim 1, wherein the parallel arm includes at least three parallel resonators.

9. A surface acoustic wave filter according to claim 1, wherein the plurality of one-port surface acoustic wave resonators are made of aluminum.

10. A surface acoustic wave filter according to claim 1, wherein the gap length is the gap length of the at least one parallel resonator.

11. A surface acoustic wave filter comprising:

an input terminal;

an output terminal;

a series arm including at least one series resonator located between the input and output terminals;

a parallel arm including at least one parallel resonator located between the series arm and a reference potential, the series arm and the parallel arm being arranged to define a ladder circuit;

a piezoelectric substrate; and a plurality of one-port surface acoustic wave resonators disposed on said piezoelectric substrate and arranged to define said at least one series resonator and said at least one parallel resonator, each of the plurality of one-port surface acoustic wave resonators including an interdigital transducer having a plurality of electrode fingers and at least two bus bars connected to the electrode fingers; wherein the at least one parallel resonator has a gap length between a first of the at least two bus bars of the interdigital transducer of the one-port surface acoustic wave resonator defining the at least one parallel resonator and a tip of one of the plurality of electrode fingers connected to a second of the at least two bus bars disposed opposite to the first of the at least two bus bars has a value of up to about 1.0 $\lambda$ in which $\lambda$ represents the wave length of a surface acoustic wave.

12. A surface acoustic wave filter according to claim 11, wherein the surface acoustic wave filter includes a plurality of the parallel resonators, and the gap lengths of each of the parallel resonators has a value of up to about 1.0 $\lambda$.

13. A surface acoustic wave filter according to claim 11, wherein said piezoelectric substrate is an $LiTaO_3$ substrate.

14. A surface acoustic wave filter according to claim 11, further comprising first, second and third parallel arms.

15. A surface acoustic wave filter according to claim 14, wherein the first, second, and third parallel arms are located between the at least one series arm and the reference electrode so as to define the ladder circuit.

16. A surface acoustic wave filter according to claim 11, wherein the series arm includes at least two series resonators.

17. A surface acoustic wave filter according to claim 11, wherein the parallel arm includes at least three parallel resonators.

18. A surface acoustic wave filter according to claim 11, wherein the plurality of one-port surface acoustic wave resonators are made of aluminum.

* * * * *